United States Patent
Hekstra

(10) Patent No.: US 9,564,455 B2
(45) Date of Patent: Feb. 7, 2017

(54) DISPLAY PANEL

(71) Applicant: Innolux Corporation, Chu-Nan (TW)

(72) Inventor: Gerben Johan Hekstra, Chu-Nan (TW)

(73) Assignee: INNOLUX CORPORATION, Chu-Nan (TW)

(*) Notice: Subject to any disclaimer, the term of this patent is extended or adjusted under 35 U.S.C. 154(b) by 125 days.

(21) Appl. No.: 14/335,172

(22) Filed: Jul. 18, 2014

(65) Prior Publication Data

US 2015/0294985 A1    Oct. 15, 2015

Related U.S. Application Data

(60) Provisional application No. 61/977,651, filed on Apr. 10, 2014.

(51) Int. Cl.
| | |
|---|---|
| *H01L 23/58* | (2006.01) |
| *H01L 27/12* | (2006.01) |
| *H01L 29/786* | (2006.01) |
| *H01L 27/02* | (2006.01) |

(52) U.S. Cl.
CPC ......... *H01L 27/124* (2013.01); *H01L 27/0296* (2013.01); *H01L 29/7866* (2013.01)

(58) Field of Classification Search
CPC .................................................... H01L 27/124
USPC .......................................................... 257/491
See application file for complete search history.

(56) References Cited

U.S. PATENT DOCUMENTS

| | | | |
|---|---|---|---|
| 9,276,055 B1* | 3/2016 | Son ..................... | H01L 27/3276 |
| 2002/0109814 A1 | 8/2002 | Murahashi et al. | |
| 2015/0302815 A1* | 10/2015 | Marushima ......... | G02F 1/13452 345/3.2 |
| 2015/0382446 A1* | 12/2015 | Kwon ................... | H05K 1/028 174/251 |

* cited by examiner

*Primary Examiner* — David Vu
*Assistant Examiner* — Brandon Fox
(74) *Attorney, Agent, or Firm* — Rabin & Berdo, P.C.

(57) ABSTRACT

A display panel is provided. The display panel includes has an active area and a border area surrounding the active area. The display panel includes a plurality of pixels, a plurality of multiplexer portion, a gate driver portion and a source routing portion. The pixels are located in the active area. The multiplexer portion is located in the border area. The gate driver portion is located in the border area. The source routing portion is located in the border area. In part of the border area, at least part of the multiplexer portion, at least part of the gate driver portion and at least part of the source routing portion are located and sequentially arranged from an internal edge of the border area to an external edge of the border area.

13 Claims, 7 Drawing Sheets

DISPLAY PANEL

This application claims the benefit of U.S. provisional application Ser. No. 61/977,651, filed Apr. 10, 2014, the disclosure of which is incorporated by reference herein in its entirety.

TECHNICAL FIELD

The disclosure relates in general to a panel, and more particularly to a display panel.

BACKGROUND

Accompanied with great advancement of the display technique, a display panel is integrated into various devices. For example, the display panel can be integrated into a smart phone, a tablet computer or a TV.

In a conventional display panel, an outline of an active area is rectangle. The application of the display panel is limited due to the rectangle shaped active area.

SUMMARY

The disclosure is directed to a display panel. Some circuits are disposed in the same region of a border area, such that an active area of the display panel can be designed as free shape whose outline is an arc, a polygon, or a substantially round shape for various applications. The substantially round shape has four extremes and each connecting line connecting two adjacent extremes is monotonically increasing or monotonically decreasing.

According to one embodiment, a display panel is provided. The display panel includes has an active area and a border area surrounding the active area. The display panel includes a plurality of pixels, a plurality of multiplexer (MUX) portion, a gate driver portion and a source routing portion. The pixels are located in the active area. The multiplexer portion is located in the border area. The gate driver portion is located in the border area. The source routing portion is located in the border area. In part of the border area, at least part of the multiplexer portion, at least part of the gate driver portion and at least part of the source routing portion are located and sequentially arranged from an internal edge of the border area to an external edge of the border area.

According to another embodiment, a display panel is provided. The display panel has an active area and a border area surrounding the active area. The display panel includes a plurality of pixels, an electrostatic discharge (ESD) protecting portion, a gate driver portion and a source routing portion. The pixels are located in the active area. The electrostatic discharge protecting portion is located in the border portion. The gate driver portion is located in the border area. The source routing portion is located in the border area. In part of the border area, at least part of the electrostatic discharge protecting portion, at least part of the gate driver portion and at least part of the source routing portion are located and sequentially arranged from an internal edge of the border area to an external edge of the border area.

According to an alternative embodiment, a display panel is provided. The display panel has an active area and a border area surrounding the active area. The display panel includes a plurality of pixels, a gate driver portion and a source routing portion. The pixels are located in the active area. The gate driver portion is located in the border area. The source routing portion is located in the border area. A plurality lines connected the source routing portion pass through at least part of the gate driver portion.

Figure 1A:
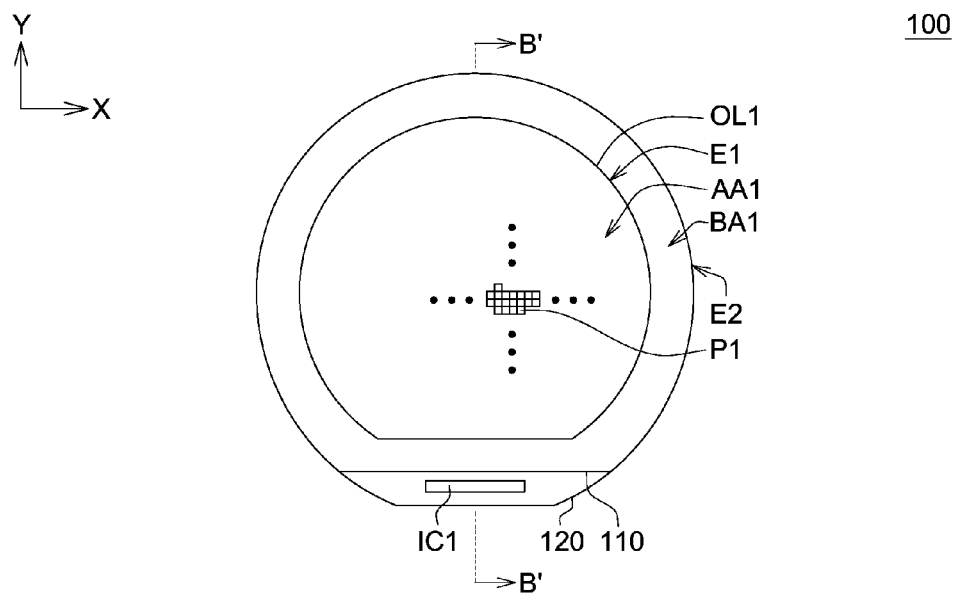
FIG. 1A shows a display panel according an embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1B:
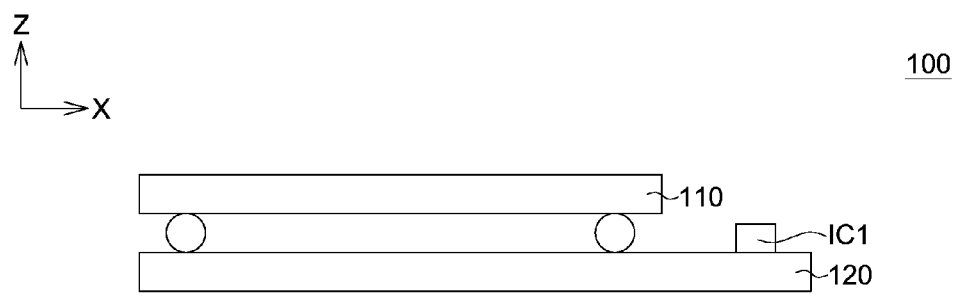
FIG. 1B shows a cross section view of the display panel of FIG. 1A along a sectional line B-B'.

Please referring to FIGS. 1A and 1B, FIG. 1A shows a display panel 100 according an embodiment of the present invention, and FIG. 1B shows a cross section view of the display panel 100 of FIG. 1A along a sectional line B-B'. The display panel 100 includes a first substrate 110 and a second substrate 120. The first substrate 110 may be a color filter (CF) substrate, and the second substrate 120 may be a thin film transistor (TFT) array substrate. The second substrate 120 is larger than the first substrate 110 for disposing a driving chip 101.

The display panel 100 has an active area AA1 and a border area BA1. The active area AA1 is used for displaying image, and the border area BA1 is used for disposing circuit. The border area BA1 surrounds the active area AA1. In the present embodiment, whole of an outline OL1 of the active area AA1 is an arc, a polygon or a substantially round shape. The substantially round shape has four extremes and each connecting line connecting two adjacent extremes is monotonically increasing or monotonically decreasing. For example, the active area AA1 is an incomplete circle cut by a chord.

Figure 2:
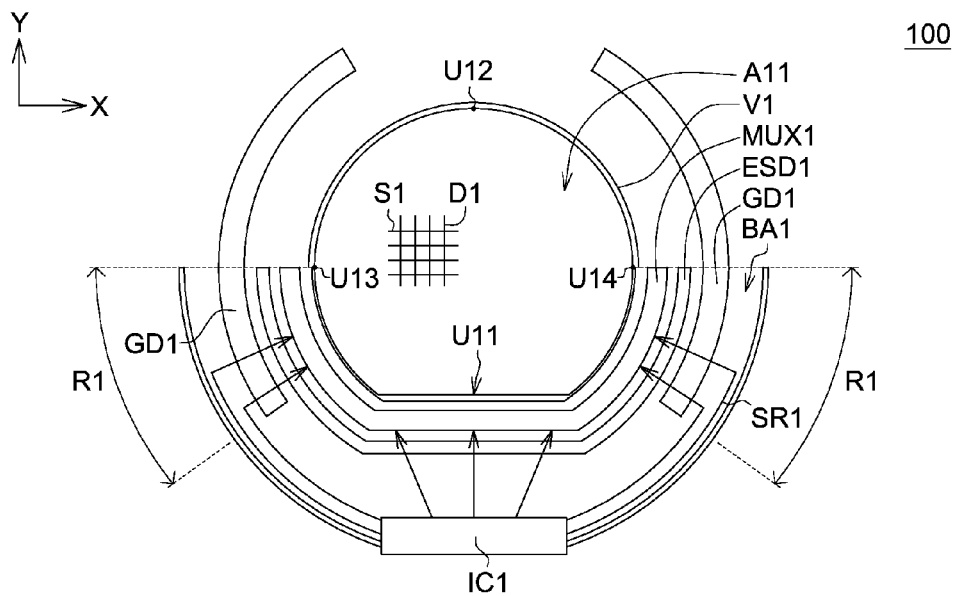
FIG. 2 shows a circuit layout of the display panel.

Please referring to FIGS. 1A and 2, FIG. 2 shows a circuit layout of the display panel 100. In the present embodiment, the display panel 100 includes a plurality of pixels P1, a common voltage portion V1, a multiplexer portion MUX1, an electrostatic discharge protecting portion ESD1, a gate driver portion GD1 and a source routing portion SR1.

The pixels P1 are arranged along a first axis X and a second axis Y substantially perpendicular to the first axis X. The common voltage portion V1 surrounds the active area AA1 for providing a common voltage.

The gate driver portion GD1 is located in the border area BA1 and corresponding two side of the active area AA1. A scan signal is transmitted from the driving chip 101 to the gate driver portion GD1 and transmitted into the active area AA1 via a plurality of scan lines S1 located in the active area AA1. In the present embodiment, the odd scan lines S1 and the even scan lines S1 are respectively connected to the right gate driver portion GD1 and the left gate driver portion GD1. In another embodiment, the gate driver portion GD1 may be corresponding only one side of the active area AA1.

The multiplexer portion MUX1 and the source routing SR1 are located in the border area BA1 and corresponding one side of the active area AA1. A plurality lines connected the source routing portion SR1 and the multiplexer portion MUX1 pass through at least part of the gate driver portion GD1. A data signal is transmitted from the driving chip 101 to the multiplexer portion MUX1 via the source routing portion SR1. Then, the data signal is transmitted into the active area AA1 via a plurality of data lines D1. The multiplexer portion MUX1 includes at least one MUX circuit MC (shown in FIG. 3A) which is used for distributing the data signal to 9 or 12 data lines D1. The multiplexer portion MUX1 can reduce the circuit density for narrowing the border area BA1. In the present embodiment, the first substrate 120 may be a low temperature poly-silicon (LTPS) substrate where the MUX circuit MC can be formed. In another embodiment, the first substrate 120 may be an amorphous silicon (a-Si) substrate where the MUX circuit MC cannot be formed.

The electrostatic discharge protecting portion ESD1 is located in the border area BA1 for preventing the data lines D1 from any ESD issue.

Referring to FIG. 2, the scan lines S1 are parallel to the first axis X and range from a first utmost end U11 to a second utmost end U12 along the second axis Y. For connecting all of the scan lines S1, the gate driver portion GD1 is located from the first utmost end U11 to the second utmost end U12 along the second axis Y.

Referring to FIG. 2, the data lines D1 are parallel to the second axis Y and range from a third utmost end U13 to a fourth utmost end U14 along the first axis X. For connecting all of the data lines D1, the multiplexer portion MUX1 is located from the third utmost end U13 to the fourth utmost end U14 along the first axis X. For protecting all of the data lines D1, the electrostatic discharge protecting portion ESD1 is located from the third utmost end U13 to the fourth utmost end U14 along the first axis X.

For connecting the gate driver portion GD1 to all of the scan lines S1, connecting the multiplexer portion MUX1 to all of the data line D1 and protecting all of the data lines D1, in a region R1 of the border area BA1, part of the multiplexer portion MUX1, part of the electrostatic discharge protecting portion ESD1, part of the gate driver portion GD1 and part of the source routing portion SR1 are located.

Referring to FIG. 2, in the region R1 of the border area BA1, the multiplexer portion MUX1, the electrostatic discharge protecting portion ESD1, the gate driver portion GD1 and the source routing portion SR1 are sequentially arranged from an internal edge E1 (shown in FIG. 1A) of the border area BA1 to an external edge E2 (shown in FIG. 1A) of the border area BA1.

Figure 3A:
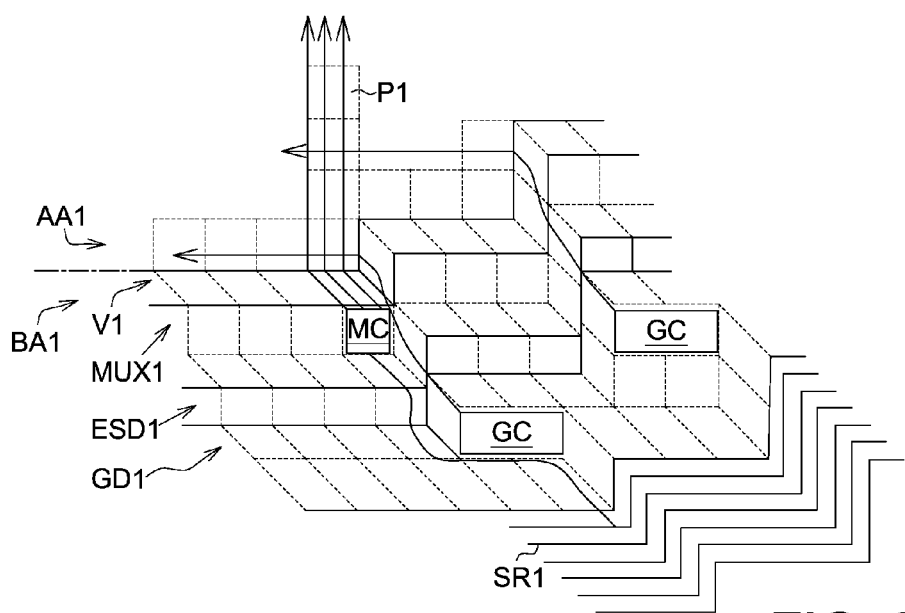
FIG. 3A shows an enlarge diagram of a region of FIG. 2 according to an embodiment.

Moreover, please referring to FIG. 3A, an enlarge diagram of the region R1 of FIG. 2 according to an embodiment is shown. The active area AA1 is composed of a plurality of rectangular patterns. The multiplexer portion MUX1 is composed of a plurality of rectangular patterns and a plurality of parallelogram patterns. The MUX circuit MC is located in one of the rectangular patterns. The electrostatic discharge protecting portion ESD1 is composed of a plurality of rectangular patterns. The gate driver portion GD1 is composed of a plurality of rectangular patterns and a plurality of parallelogram patterns. Each gate driver circuit GC is located in one of the rectangular patterns. A plurality of wiring lines of the source routing portion SR1 are disposed along a saw shaped line.

Figure 3B:
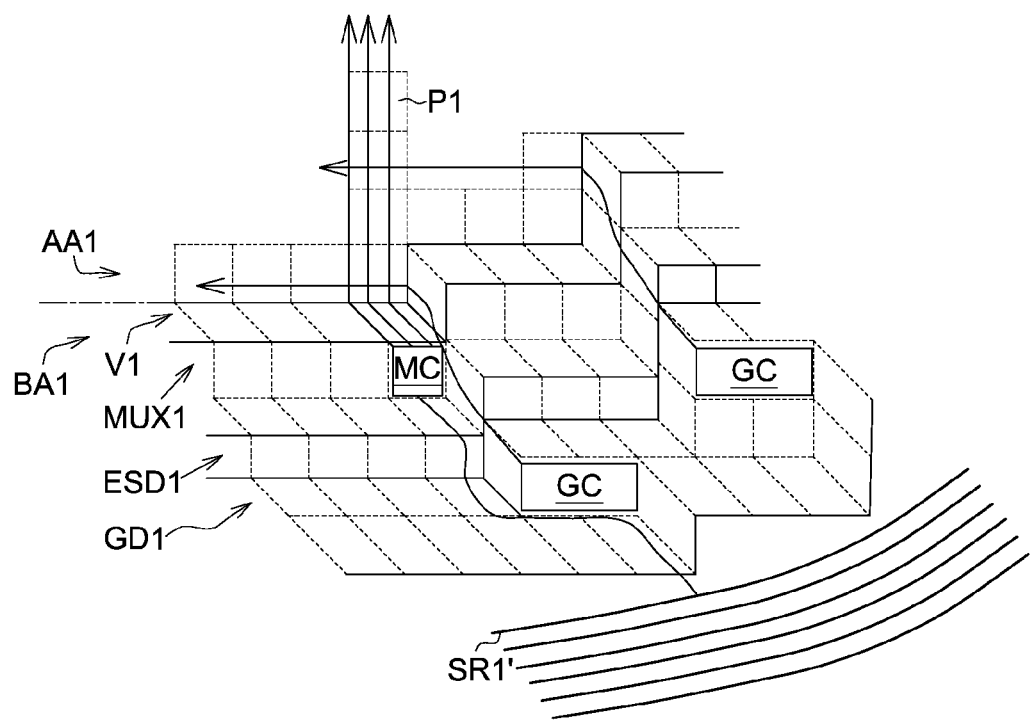
FIG. 3B shows an enlarge diagram of the region of FIG. 2 according to another embodiment.

In another embodiment, please referring to FIG. 3B, an enlarge diagram of the region R1 of FIG. 2 according to another embodiment is shown. In this embodiment, the wiring lines of the source routing portion SR1' are disposed along an arc line.

Figure 4:
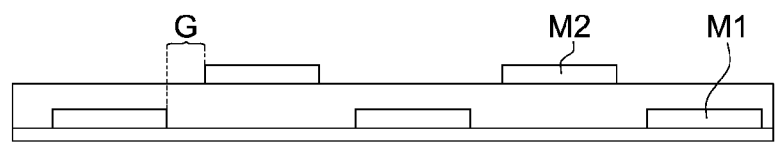
FIG. 4 shows two wiring lines stacked in two layers.

Further, please refer to FIG. 4, which shows two wiring lines M1 and M2 stacked in two layers. The wiring lines M1 and M2 are stacked in two layers, and the gap G between wiring lines M1 and M2 can be reduced without any interference. For enlarging the active area AA1, the border area BA1 is needed to be narrowed under 1.1 mm. In this embodiment, a plurality of wiring lines of the source routing portion SR1 can be disposed in two layers for narrowing the border area BA1.

In FIG. 1A, the outline OL1 of the active area AA1 is an incomplete circle cut by one chord and the display panel 100 includes one driving chip 101. However, the outline of the active area and the number of the driving chip is not limited thereto. For example, please refer to FIG. 5, which shows a display panel 200 according to another embodiment. An outline OL2 of an active area AA2 is an incomplete circle cut by two chords. The display panel 200 includes two driving chip IC2.

Figure 5:
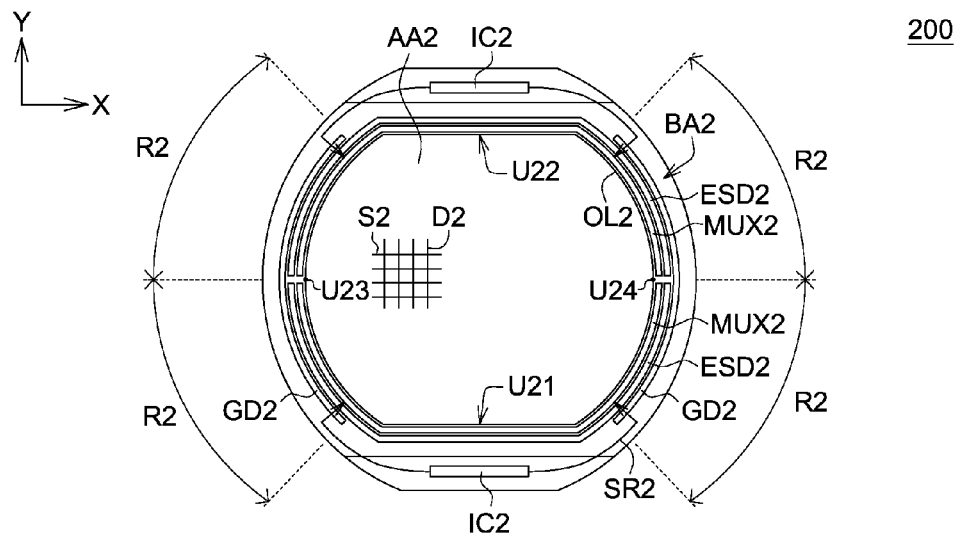
FIG. 5 shows a display panel according to another embodiment.

Referring to FIG. 5, a plurality of scan lines S2 are parallel to the first axis X and range from a first utmost end U21 to a second utmost end U22 along the second axis Y. For connecting all of the scan lines S2, the gate driver portion GD2 is located from the first utmost end U21 to the second utmost end U22 along the second axis Y.

Referring to FIG. 5, a plurality of data lines D2 are parallel to the second axis Y and range from a third utmost end U23 to a fourth utmost end U24 along the first axis X. For connecting all of the data lines D2, the multiplexer portion MUX2 is located from the third utmost end U23 to the fourth utmost end U24 along the first axis X. For protecting all of the data lines D2, the electrostatic discharge protecting portion ESD2 is located from the third utmost end U23 to the fourth utmost end U24 along the first axis X.

In FIG. 5, the display panel 200 includes two driving chip IC2. The source lines S2 are interlaced between the two driving chip IC2. Two multiplexer portions MUX2 are located at both sides and two electrostatic discharge protecting portions ESD2 are located at both sides.

For connecting the gate driver portion GD2 to all of the scan lines S2, connecting the multiplexer portion MUX2 to all of the data line D2 and protecting all of the data lines D2, in a region R2 of a border area BA2, part of the multiplexer portion MUX2, part of the electrostatic discharge protecting portion ESD2, part of the gate driver portion GD2 and part of a source routing portion SR2 are located.

Referring to FIG. 5, in the region R2 of the border area BA2, the multiplexer portion MUX2, the electrostatic discharge protecting portion ESD2, the gate driver portion GD2 and the source routing portion SR2 are sequentially arranged.

Figure 6:
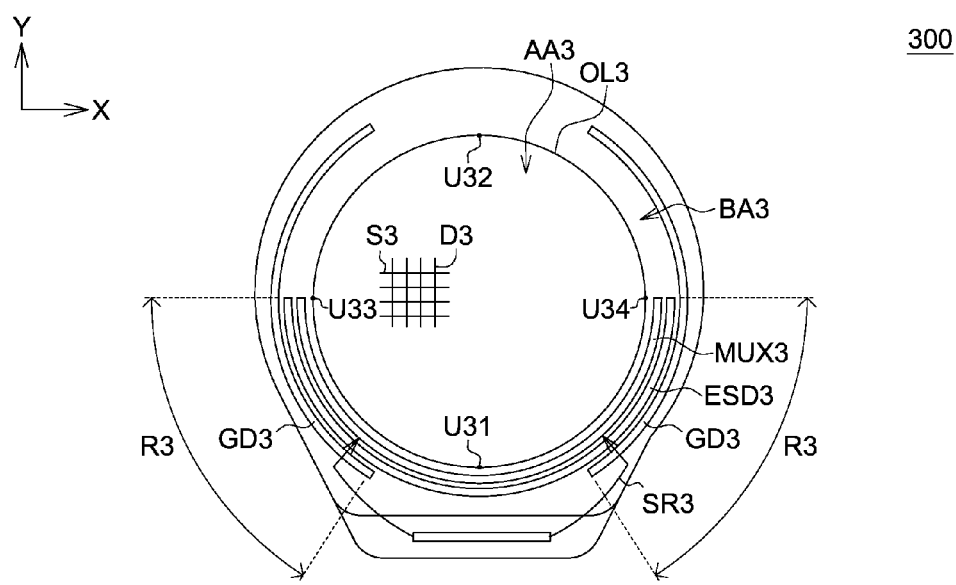
FIG. 6 shows a display panel according to another embodiment.

Further, please refer to FIG. 6, which shows a display panel 300 according to another embodiment. An outline OL3 of an active area AA3 is a complete circle.

Referring to FIG. 6, a plurality of scan lines S3 are parallel to the first axis X and range from a first utmost end U31 to a second utmost end U32 along the second axis Y. For connecting all of the scan lines S3, the gate driver portion GD3 is located from the first utmost end U31 to the second utmost end U32 along the second axis Y.

Referring to FIG. 6, a plurality of data lines D3 are parallel to the second axis Y and range from a third utmost end U33 to a fourth utmost end U34 along the first axis X. For connecting all of the data lines D3, the multiplexer portion MUX3 is located from the third utmost end U33 to the fourth utmost end U34 along the first axis X. For protecting all of the data lines D3, the electrostatic discharge protecting portion ESD3 is located from the third utmost end U33 to the fourth utmost end U34 along the first axis X.

For connecting the gate driver portion GD3 to all of the scan lines S3, connecting the multiplexer portion MUX3 to all of the data line D3 and protecting all of the data lines D3, in a region R3 of a border area BA3, part of the multiplexer portion MUX3, part of the electrostatic discharge protecting portion ESD3, part of the gate driver portion GD3 and part of a source routing portion SR3 are located.

Referring to FIG. 6, in the region R3 of the border area BA3, the multiplexer portion MUX3, the electrostatic discharge protecting portion ESD3, the gate driver portion GD3 and the source routing portion SR3 are sequentially arranged.

Figure 7:
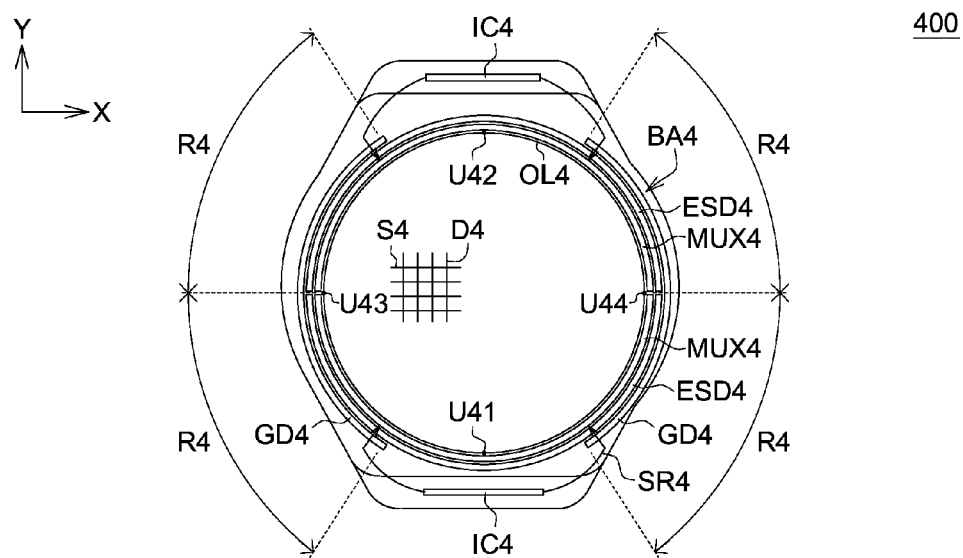
FIG. 7 shows a display panel according to another embodiment.

Moreover, please refer to FIG. 7, which shows a display panel 400 according to another embodiment. An outline OL4 of an active area AA4 is a complete circle. The display panel 400 includes two driving chip 104.

Referring to FIG. 7, a plurality of scan lines S4 are parallel to the first axis X and range from a first utmost end U41 to a second utmost end U42 along the second axis Y. For connecting all of the scan lines S4, the gate driver portion GD4 is located from the first utmost end U41 to the second utmost end U42 along the second axis Y.

Referring to FIG. 7, a plurality of data lines D4 are parallel to the second axis Y and range from a third utmost end U43 to a fourth utmost end U44 along the first axis X. For connecting all of the data lines D4, the multiplexer portion MUX4 is located from the third utmost end U43 to the fourth utmost end U44 along the first axis X. For protecting all of the data lines D4, the electrostatic discharge protecting portion ESD4 is located from the third utmost end U43 to the fourth utmost end U44 along the first axis X.

For connecting the gate driver portion GD4 to all of the scan lines S4, connecting the multiplexer portion MUX4 to all of the data line D4 and protecting all of the data lines D4, in a region R4 of a border area BA4, part of the multiplexer portion MUX4, part of the electrostatic discharge protecting portion ESD4, part of the gate driver portion GD4 and part of a source routing portion SR4 are located.

Referring to FIG. 7, in the region R4 of the border area BA4, the multiplexer portion MUX4, the electrostatic discharge protecting portion ESD4, the gate driver portion GD4 and the source routing portion SR4 are sequentially arranged.

In FIG. 7, the display panel 400 includes two driving chip IC4. The source lines S4 are interlaced between the two driving chip IC4. Two multiplexer portions MUX4 are located at both sides and two electrostatic discharge protecting portions ESD4 are located at both sides.

Figure 8:
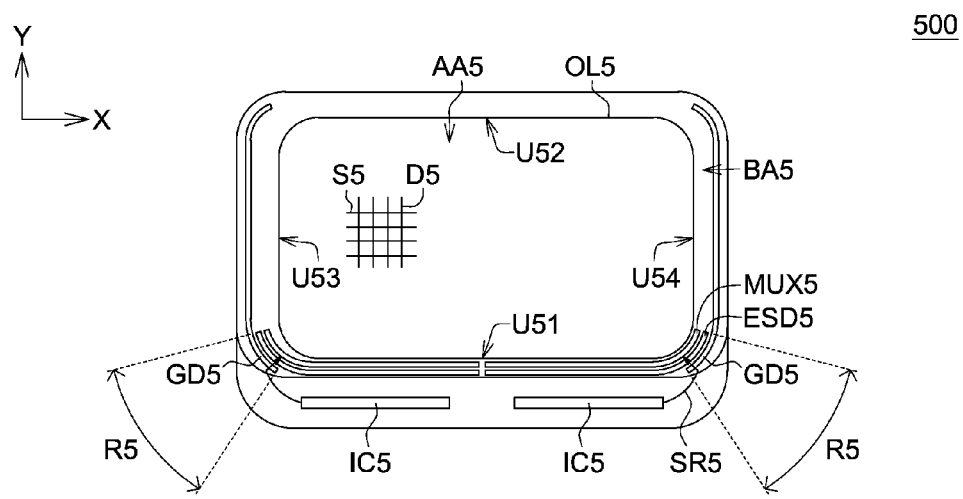
FIG. 8 shows a display panel according to another embodiment.

Further, please refer to FIG. 8, which shows a display panel 500 according to another embodiment. An outline OL5 of an active area AA5 is formed from a rectangle having four round corners.

Referring to FIG. 8, a plurality of scan lines S5 are parallel to the first axis X and range from a first utmost end U51 to a second utmost end U52 along the second axis Y. For connecting all of the scan lines S5, the gate driver portion GD5 is located from the first utmost end U51 to the second utmost end U52 along the second axis Y.

Referring to FIG. 8, a plurality of data lines D5 are parallel to the second axis Y and range from a third utmost end U53 to a fourth utmost end U54 along the first axis X. For connecting all of the data lines D5, the multiplexer portion MUX5 is located from the third utmost end U53 to the fourth utmost end U54 along the first axis X. For protecting all of the data lines D5, the electrostatic discharge protecting portion ESD5 is located from the third utmost end U53 to the fourth utmost end U54 along the first axis X.

For connecting the gate driver portion GD5 to all of the scan lines S5, connecting the multiplexer portion MUX5 to all of the data line D5 and protecting all of the data lines D5, in a region R5 of a border area BA5, part of the multiplexer portion MUX5, part of the electrostatic discharge protecting portion ESD5, part of the gate driver portion GD5 and part of a source routing portion SR5 are located.

Referring to FIG. 8, in the region R5 of the border area BA5, the multiplexer portion MUX5, the electrostatic discharge protecting portion ESD5, the gate driver portion GD5 and the source routing portion SR5 are sequentially arranged.

Figure 9:
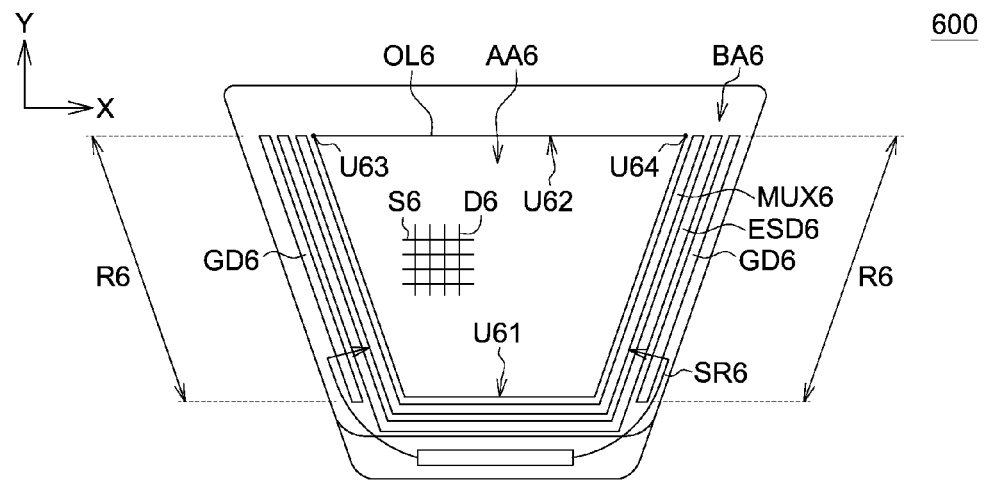
FIG. 9 shows a display panel according to another embodiment.

Moreover, please refer to FIG. 9, which shows a display panel 600 according to another embodiment. An outline OL6 of an active area AA6 is an inverted trapezoid.

Referring to FIG. 9, a plurality of scan lines S6 are parallel to the first axis X and range from a first utmost end U61 to a second utmost end U62 along the second axis Y. For connecting all of the scan lines S6, the gate driver portion GD6 is located from the first utmost end U61 to the second utmost end U62 along the second axis Y.

Referring to FIG. 9, a plurality of data lines D6 are parallel to the second axis Y and range from a third utmost end U63 to a fourth utmost end U64 along the first axis X. For connecting all of the data lines D6, the multiplexer portion MUX6 is located from the third utmost end U63 to the fourth utmost end U64 along the first axis X. For protecting all of the data lines D6, the electrostatic discharge protecting portion ESD6 is located from the third utmost end U63 to the fourth utmost end U64 along the first axis X.

For connecting the gate driver portion GD6 to all of the scan lines S6, connecting the multiplexer portion MUX6 to all of the data line D6 and protecting all of the data lines D6, in a region R6 of a border area BA6, part of the multiplexer portion MUX6, part of the electrostatic discharge protecting portion ESD6, the gate driver portion GD6 and part of a source routing portion SR6 are located.

Referring to FIG. 9, in the region R6 of the border area BA6, the multiplexer portion MUX6, the electrostatic discharge protecting portion ESD6, the gate driver portion GD6 and the source routing portion SR6 are sequentially arranged.

Figure 10:
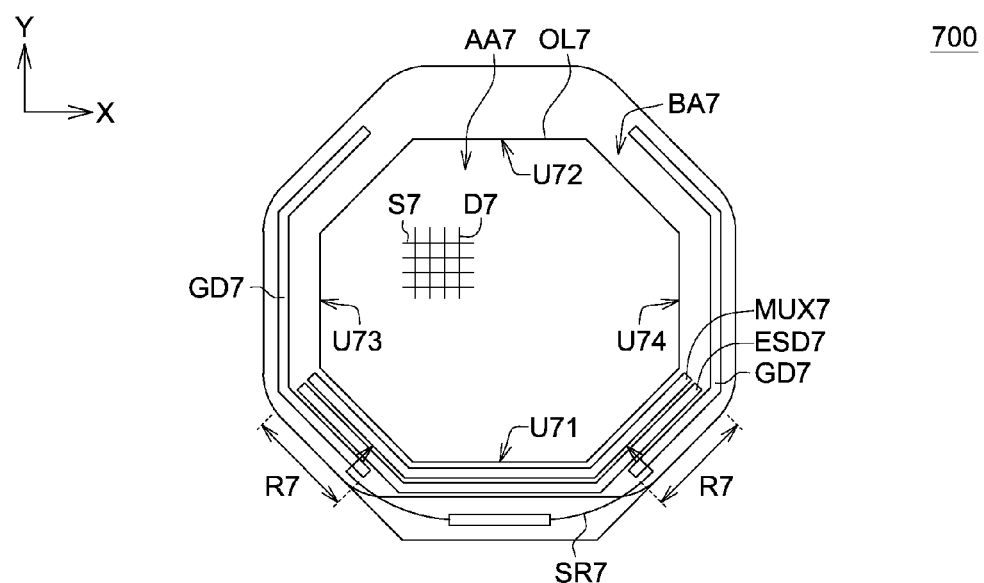
FIG. 10 shows a display panel according to another embodiment.

Further, please refer to FIG. 10, which shows a display panel 700 according to another embodiment. An outline OL7 of an active area AA7 is an octagon.

Referring to FIG. 10, a plurality of scan lines S7 are parallel to the first axis X and range from a first utmost end U71 to a second utmost end U72 along the second axis Y. For connecting all of the scan lines S7, the gate driver portion GD7 is located from the first utmost end U71 to the second utmost end U72 along the second axis Y.

Referring to FIG. 10, a plurality of data lines D7 are parallel to the second axis Y and range from a third utmost end U73 to a fourth utmost end U74 along the first axis X. For connecting all of the data lines D7, the multiplexer portion MUX7 is located from the third utmost end U73 to the fourth utmost end U74 along the first axis X. For protecting all of the data lines D7, the electrostatic discharge protecting portion ESD7 is located from the third utmost end U73 to the fourth utmost end U74 along the first axis X.

For connecting the gate driver portion GD7 to all of the scan lines S7, connecting the multiplexer portion MUX7 to all of the data line D7 and protecting all of the data lines D7, in a region R7 of a border area BA7, part of the multiplexer portion MUX7, part of the electrostatic discharge protecting portion ESD7, part of the gate driver portion GD7 and part of a source routing portion SR7 are located.

Referring to FIG. 10, in the region R7 of the border area BA7, the multiplexer portion MUX7, the electrostatic discharge protecting portion ESD7, the gate driver portion GD7 and the source routing portion SR7 are sequentially arranged.

Figure 11:
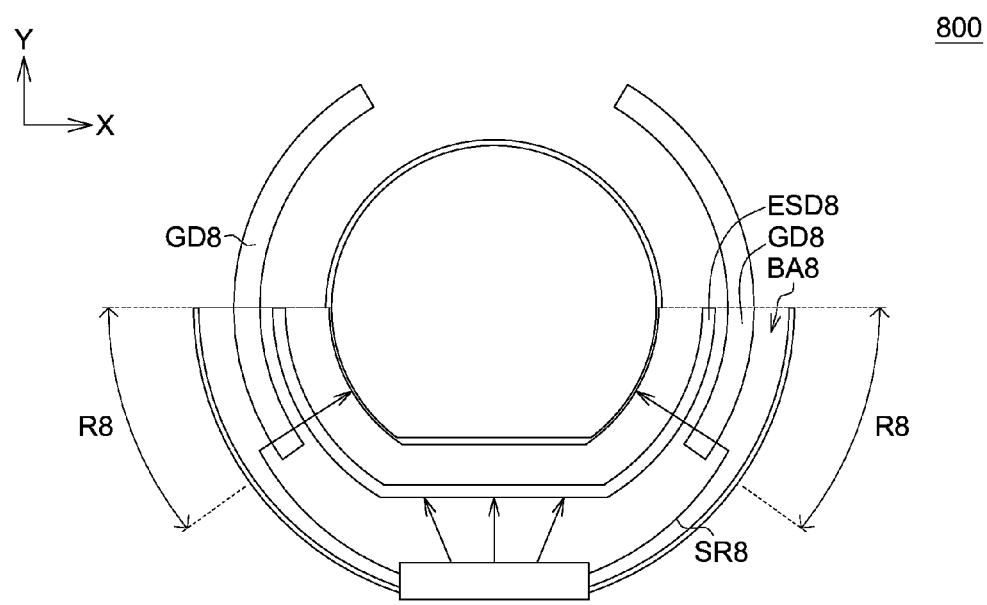
FIG. 11 shows a display panel according to another embodiment.

Moreover, please refer to FIG. 11, which shows a display panel 800 according to another embodiment. In this embodiment, the display panel 800 includes a second substrate (not shown) which is an a-Si substrate. In this embodiment, there is no multiplexer portion located in a border area BA8. In a region R8, the electrostatic discharge protecting portion ESD8, the gate driver portion GD8 and the source routing portion SR8 are located and arranged sequentially.

According to those embodiment described above, at least part of the multiplexer portion, at least part of the electrostatic discharge protecting portion, at least part of the gate driver portion and at least part of the source routing portion are disposed in the same region of the border area. As such, the active area of the display panel can be designed as free shape whose outline is an arc, a polygon or a substantially round shape. The substantially round shape has four extremes and each connecting line connecting two adjacent extremes is monotonically increasing or monotonically decreasing.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A display panel, having an active area and a border area surrounding the active area, wherein the display panel comprises:
    a plurality of pixels located in the active area;
    a multiplexer (MUX) portion located in the border area;
    a gate driver portion located in the border area; and
    a source routing portion located in the border area, wherein in part of the border area, at least part of the multiplexer portion, at least part of the gate driver portion and at least part of the source routing portion are located and sequentially arranged from an internal edge of the border area to an external edge of the border area.

2. The display panel according to claim 1, further comprising:
    an electrostatic discharge (ESD) protecting portion located in the border portion, wherein in part of the border area, at least part of the multiplexer portion, at least part of the electrostatic discharge protecting portion, at least part of the gate driver portion and at least part of the source routing portion are located and sequentially arranged from the internal edge of the border area to the external edge of the border area.

3. The display panel according to claim 1, wherein the pixels are arranged along a first axis and a second axis substantially perpendicular to the first axis, the active area has two utmost ends along the first axis, and the multiplexer portion is located from one of the utmost ends to another one of the utmost ends.

4. The display panel according to claim 1, wherein the pixels are arranged along a first axis and a second axis substantially perpendicular to the first axis, the active area has two utmost ends along the second axis, and the gate driver portion is located from one of the utmost ends to another one of the utmost ends.

5. The display panel according to claim 1, wherein whole of an outline of the active area is a substantially round shape.

6. The display panel according to claim 1, wherein a plurality lines connected the source routing portion and the multiplexer portion pass through at least part of the gate driver portion.

7. The display panel according to claim 1, wherein a plurality of wiring lines of the source routing portion are disposed in two layers.

8. A display panel, having an active area and a border area surrounding the active area, wherein the display panel comprises:
    a plurality of pixels located in the active area;
    an electrostatic discharge (ESD) protecting portion located in the border portion;
    a gate driver portion located in the border area; and
    a source routing portion located in the border area, wherein in part of the border area, at least part of the electrostatic discharge protecting portion, at least part of the gate driver portion and at least part of the source routing portion are located and sequentially arranged from an internal edge of the border area to an external edge of the border area.

9. The display panel according to claim 8, wherein the pixels are arranged along a first axis and a second axis substantially perpendicular to the first axis, the active area has two utmost ends along the first axis, and the electrostatic discharge protecting portion is located from one of the utmost ends to another one of the utmost ends.

10. The display panel according to claim 8, wherein the pixels are arranged along a first axis and a second axis substantially perpendicular to the first axis, the active area has two utmost ends along the second axis, and the gate driver portion is located from one of the utmost ends to another one of the utmost ends.

11. The display panel according to claim 8, wherein whole of an outline of the active area is a substantially round shape.

12. The display panel according to claim 8, wherein a plurality lines connected the source routing portion pass through at least part of the gate driver portion.

13. The display panel according to claim 8, wherein a plurality of wiring lines of the source routing portion are disposed in two layers.

* * * * *